Aug. 23, 1966 V. S. FORNI ETAL 3,268,832

HIGH FREQUENCY OSCILLATOR WITH ZERO GRID BIAS

Filed June 22, 1962

INVENTORS
VINCENT S. FORNI
FRED J. KITTY
BY James and Franklin
ATTORNEYS

United States Patent Office 3,268,832
Patented August 23, 1966

3,268,832
HIGH FREQUENCY OSCILLATOR WITH ZERO GRID BIAS

Vincent S. Forni, Feeding Hills, and Fred J. Kitty, Springfield, Mass., assignors to General Instrument Corporation, Newark, N.J., a corporation of New Jersey
Filed June 22, 1962, Ser. No. 204,387
20 Claims. (Cl. 331—96)

Figure 1:
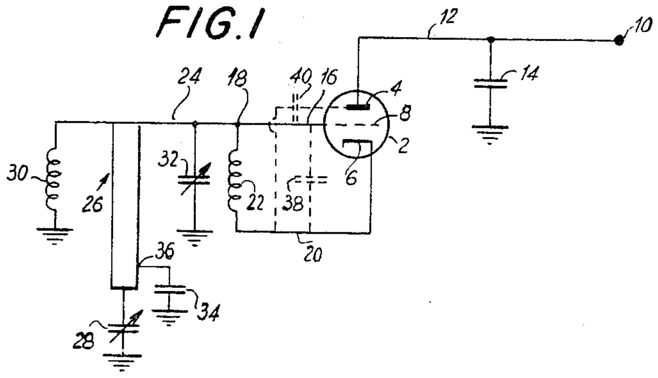

The present invention relates to high frequency oscillator circuitry having improved operating characteristics.

Many problems have arisen in connection with the design of local oscillators, such as those which are to provide heterodyning signals for television tuners, and particularly those operating in the UHF spectrum, where frequencies between approximately 500 mc. and 950 mc. are involved. Such oscillator circuits require the application of appreciable plate potential, on the order of 60 to 70 volts, if the circuits are to supply sufficient power to the mixer to which they are connected. Bias is provided for the grid of the oscillator tube in order to prevent the tube from exceeding its rating in power input, and in effect what happens when the circuit is operative is that its oscillations build up until the tube cuts off, there is a period when little or no oscillation occurs, oscillation again builds up to cut-off and so on, this cycle repeating very rapidly. At the frequencies involved parasitic oscillations tend to occur at different portions of the overall circuitry of the tuner. The inherent capacitance and inductance of leads and connections define circuits which are resonant at the frequencies involved. These parasitic oscillations are deleterious to the overall operation of the tuner, and special circuit means have had to be provided (e.g. a choke coil connected in the cathode circuit of the oscillator tube) in an effort to prevent them from occurring. In general the parasitic situation is not completely cured by such expedients, but is merely brought to manageable or acceptable proportions.

The oscillator circuits of the prior art exhibit another phenomenon which is undesirable. As the frequency of the oscillator is increased the current to the mixer drops off sharply at a particular frequency and then rises sharply again. This phenomenon is caused by a "mode change," and requires that the oscillator be driven sufficiently hard to compensate for the drop in mixer current at the point where the mode change occurs. In addition, over and above this mode change effect, there is an appreciable variation in current to the mixer as the frequency changes, and in order to ensure that the mixer receives an adequate amount of current at the low and high ends of the frequency spectrum, where the mixer current is comparatively low, the oscillator must be driven comparatively strongly. The result is that when the oscillator is functioning around the middle of the frequency spectrum, it has an output larger than is necessary. This not only represents a waste of power, but also contributes to the creation of parasitic oscillations and additional radiation.

While mode changing and parasitic oscillations do not present substantial problems at VHF frequencies, or at frequencies as low as about 10 mc., oscillator circuits operating at those frequencies require appreciable amounts of power and involve the use of circuitry which leaves much to be desired in the way of simplicity and economy.

The prime object of the present invention is to devise an oscillator circuit particularly suitable for use in the UHF television spectrum, and also advantageously useable in the VHF television spectrum, which avoids the above disadvantages and which, in particular, substantially eliminates parasitic oscillations, has a more uniform output-current frequency characteristic, does not exhibit "mode change" phenomena, operates at lower voltages and uses less power than has previously been deemed necessary, decreases the amount of radiation emanating from the oscillator, and may be fabricated more economically.

With the circuit of the present invention adequate current to the mixer is produced with the use of plate potentials, applied to the oscillator tube, on the order of 15–20 volts, this being several times less than has previously been required. As a result considerably less power is consumed since the output current of the oscillator is substantially the same as has previously been employed. Thus the circuit of the present invention is particularly valuable for battery-operated television receivers, where voltage and power problems are critical. It has been found that with the circuit of the present invention substantially no parasitic oscillations occur. The reason for this is not definitely known, but it is believed that the lower potential at which the oscillator operates contributes markedly to that desirable effect. It has further been observed that the output-current frequency characteristic of the present invention is much more uniform than that of circuits previously used for the same purpose, and that no mode change phenomenon occurs. Because the circuit of the present invention feeds less power to the mixer, over the entire frequency spectrum, less radiation emanates from the oscillator, and hence shielding problems are minimized. Moreover, the circuit of the present invention is more economical than previous circuits insofar as fabrication is concerned, because many circuit elements are omitted, particularly those elements previously required for grid biasing and for suppression of parasitic oscillations.

Contrary to what has previously been thought necessary, the oscillator of the present invention utilizes an unbiased grid, which is conductively connected to the cathode by means of a connection having a predetermined small value of inductance. The grid and cathode are tapped to the capacitance of a tank circuit, and an RF choke coil is connected between the grid and cathode on the one hand and ground return on the other hand. The requisite coupling between the plate and cathode of the oscillator tube, in order to produce the feedback needed for oscillation, is derived primarily from the interelectrode capacitance of the tube elements.

Figure 2:
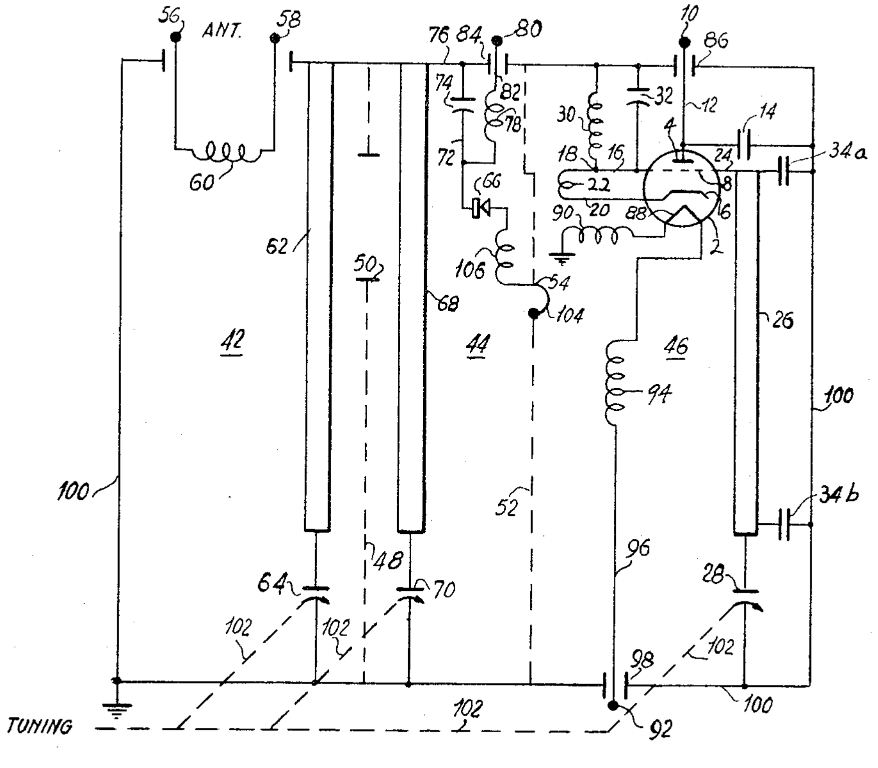

To the accomplishment of the above, and to such other objects as may hereinafter appear, the present invention relates to oscillator circuitry as defined in the appended claims and as described in this specification, taken together with the accompanying drawings, in which:

FIG. 1 is a circuit diagram of one embodiment of the oscillator circuit of the present invention; and FIG. 2 is a circuit diagram of a UHF television tuner utilizing the oscillator circuit of FIG. 1.

Referring first to FIG. 1, which discloses the oscillator circuit per se, oscillator tube 2 is provided with plate 4, cathode 6 and grid 8. The tube 2 may be of any type suitable for use within the desired high frequency range. For oscillators operating in the UHF spectrum between approximately 500 mc. and 950 mc., the tube 2 can comprise a 6DV4 or 6DS4 Nuvistor, or a more conventional 6AF4A tube. For operation in the VHF spectrum, where oscillations on the order of 100–260 mc. are to be produced, the tube 2 could, for example, be defined by the triode section of a 6BL8 tube.

The plate 4 is connected to a source 10 of plate biasing potential by lead 12, and by-pass capacitor 14 is connected between the lead 12 and ground. The plate potential provided by the source 10 may be on the order of 15 to 20 volts, which is three to four times less than the biasing potential usually required for local oscillator circuits.

Lead 16 is electrically connected to grid 8 and extends to point 18. The cathode 6 is connected to point 18 via lead 20 and inductance 22. The elements 16, 20 and 22 thus define a D.C. conductive path between the cathode 6 and the grid 8. The inductance 22 may be defined by a separate circuit element, or it may be inherent in conventional lead or connection structures.

The point 18 is connected by lead 24 to one end of a tuneable transmission line generally designated 26 and here shown as provided with a variable capacitor element 28 connected between its other end and ground, thereby to provide for end tuning of the line 26. The upper end of the line 26 is connected to ground via inductance 30 in the form of a RF choke coil and the lead 24 is connected to ground by adjustable trimming capacitor 32. The cathode 6 and grid 8 of the tube 2 are thus connected to the line 26 in such a way that the line 26 functions as a capacitively tapped tank circuit. If desired, a capacitor 34 may be connected between ground and an appropriate point 36 on the tuned line 26 in order to provide for temperature compensation, thereby rendering the frequency of the oscillations produced relatively insensitive to changes in temperature.

The broken line capacitor 38 represents the inherent interelectrode capacitance between the cathode 6 and the grid 8, and the broken line capacitor 40 represents the inherent interelectrode capacitance between the plate 4 and the cathode 6. The ratio between the impedances defined by the interelectrode capacitances 38 and 40 determines the amplitude and phase of the feedback connection between plate and cathode. It will be noted that the inductance 22 is in parallel with the interelectrode capacitance 38, thereby modifying the phase of the feedback signal, in addition to providing a D.C. return path between cathode 6 and grid 8.

It will be noted from the above that no bias is applied to the grid 8. As a result no grid biasing circuitry, such as a biasing resistor, need be provided. According to conventional concepts one would expect that without grid biasing the circuit would not function, since no means appear to be provided for limiting the magnitude of the output. However, it has been discovered that with the circuit arrangement shown such is not the case. Instead, the circuit functions reliably and accurately to produce a uniform output at a frequency determined by the setting of the capacitors 28 and 32, in conjunction with the other elements of the tuned circuit, the said output being appreciably uniform throughout the entire frequency spectrum over which the device may be tuned. Indeed, a rather surprising phenomenon has been noted. In the conventional oscillator circuit the plate current increases when the tube is not oscillatory and decreases when it is oscillatory, apparently because oscillations cause rapid intermittent biasing of the tube to cut-off, so that the tube only conducts for a fraction of the total time involved. With the circuit of the present invention it has been observed that the plate current of the tube 2 is substantially constant whether the circuit is oscillatory or not, thus leading to the tentative conclusion that when the tube is oscillatory it does not cut itself off at any time. It is thought that the inherent interelectrode capacitances, as modified by the conductive and inductive connection between cathode 6 and grid 8, serves to maintain the tube output within proper limits in a continuous manner while oscillations occur. Whatever the true explanation of the phenomenon may be, it nevertheless is a fact that oscillatory current is produced which is adequate for feeding a UHF mixer, even though the voltage applied to the plate 4 is many times smaller than has previously been thought necessary. As a consequence the plate voltage can be supplied directly from batteries, without having to employ complicated and expensive step-up circuits, and the power consumption of the oscillator circuit is significantly less than in the case of prior art circuits used for the same purpose. Thus the circuit of the present invention appears to have exceptional utility in connection with battery-operated television receivers, where low voltage supply and low power consumption are exceedingly important factors.

It has further been found that even though the output current of the instant circuit is at the same frequency as the output current from prior art conventional circuits, parasitic oscillations in the circuit are either completely or virtually non-existent. It is believed that this most surprising result may be attributed to the fact that the voltages employed are many times lower than those associated with more conventional circuits, but whatever the reason, this phenomenon is extremely advantageous in practically all installations, since it eliminates the need for special circuit arrangements formerly utilized in attempts, usually not completely successful, to eliminate parasitic oscillations.

FIG. 2 discloses in schematic form a typical UHF tuner in which the oscillator circuit of the present invention is utilized. That tuner comprises three sections generally designated 42, 44 and 46, the sections 42 and 44 being separated by partition 48 provided with opening 50, the sections 44 and 46 being separated by partition 52 provided with openings 54. The section 42 is the antenna tuning section, the antenna being connected to terminals 56 and 58 between which inductance 60 is connected, that inductance being inductively coupled to transmission line 62 which is end-tuned by variable capacitor 64. The section 44 is the mixer section, and includes mixer crystal 66 and transmission line 68 which is end-tuned by variable capacitor 70. The antenna signal is inductively coupled from transmission line 62 to transmission line 68 via the opening 50 in the partition 48. Lead 72, capacitor 74, lead 76 and inductor 78 couple the output of the mixer crystal 76 to output terminal 80 via lead 82, that lead 82 passing through feed-through capacitor 84. The section 46 comprises the oscillator section, and the various parts of the oscillator circuit have applied thereto the same reference numerals as in FIG. 1. It will be noted that the lead 12 extending between the plate 4 and the source 10 of the plate potential passes through feed-through capacitor 86, and that the cathode 6 is provided with a heater 88 one end of which is connected to ground via choke coil 90 and the other end of which is connected to external terminal 92 via choke coil 94 and lead 96, the latter passing through feed-through capacitor 98. The temperature compensating capacitor 34 of FIG. 1 is shown in FIG. 2 as comprising a pair of such capacitors **34*a* and 34*b*, connected respectively to the upper and lower ends of the transmission line 26. The walls 100 of the tuner, together with partitions 48 and 52, are grounded, and the tuning capacitors 64, 70 and 28 are adapted to be gang-tuned, as indicated by the broken lines 102. The mixer crystal 66 is inductively coupled to the output of the oscillator circuit by means of coil 104 which extends through the opening 54 in the partition 52, and which is connected to the crystal via inductance 106, said inductance 106 serving to couple the input of the mixer crystal 76 to the output of the transmission line 68**.

Purely by way of specific example, the circuit elements making up the oscillator circuit may have the following values:

| | |
|---|---|
| Tube **2** | Nuvistor 6DV4. |
| Capacitor **14** | 137 mmf. |
| Capacitor **32** | 1.0–5.0 mmf. |
| Capacitor **34*a*** | 2.2 mmf., temperature compensated. |
| Capacitor **34*b*** | 1.0 mmf. temperature compensated. |
| Inductor **22** | One-half turn of No. 31 wire, said turn being 7/16″ long and 3/16″ wide. |
| Inductor **30** | 0.3 microhenry. |

When an 6AF4A tube is used instead of a Nuvistor 6DV4, the only change required in the circuit is to utilize an inductor 22 having an inductance of 0.07 microhenry.

It has been found that the value of the inductor 22 is best arrived at empirically, and that variations thereof do not appreciably affect the frequency of the output, but instead affect uniformity of that frequency with variations in voltage input to the plate 4. This appears to confirm the tentative belief that the inductance 22 functions cooperatively with the lead inductances and interelectrode capacitances 38 and 40 of the tube 2 in order to control the feed-back which is necessary if oscillatory action is to be produced.

While the invention has been here disclosed in connection with a transmission line 26 which is tuneable, it will be apparent that the invention could also be used with a non-tuneable transmission line 26 where a fixed oscillation frequency is desired.

Similar circuitry can be employed to produce an oscillator operable in the VHF frequency spectrum, or even at frequencies on the order of about 10 mc. by using a tube 2 suitable for VHF and by appropriately modifying the parameters of the various circuit elements to correspond to the frequency range involved.

It appears that the interelectrode capacitances within the tube 2, in combination with the external circuitry as disclosed, produce a circuit in which the oscillator tube operates within rating even though no bias is applied to the grid, and which conducts substantially continuously while oscillating, rather than for only a limited portion of the time cycle, as is the case in more conventional circuitry.

The circuits of the present invention are, therefore, less expensive than prior art circuits because they eliminate the need for certain circuit elements, particularly those employed for grid biasing and parasitic oscillation suppression, they operate at a low anode potential, and substantially eliminate parasitic oscillations without requiring special circuitry to that end. They consume a minimal amount of power and have a low plate dissipation, thus giving rise to increased electrical efficiency and minimization of undesired radiation. There is less variation in output current with frequency than in prior art circuits, and the troublesome mode change phenomenon does not appear to occur. Even where parasitic oscillations and mode changing are not significant factors, as in the VHF spectrum, the circuits of the present invention are still advantageous because of reduced power input requirements and more economical circuitry. For all of these reasons the circuit of the present invention is believed to be highly superior to prior art circuits.

While but a limited number of embodiments of the present invention have been here disclosed, it will be apparent that many variations may be made therein, all within the scope of the invention as defined in the following claims.

We claim:

1. A zero grid bias oscillator circuit operable in the high frequency range above about 10 megacycles, comprising a high frequency tube comprising a cathode, plate and grid with said plate and said cathode inherently feed-back-coupled, a connection between said grid and said cathode comprising an inductance, means for applying an operating potential between said plate and ground, said grid being free of any biasing potential, a tuned circuit, means connecting said grid to said tuned circuit, and RF choke means connected between said grid and ground.

2. The oscillator circuit of claim 1, in which said tuned circuit comprises a transmission line.

3. The oscillator circuit of claim 2, in which said operating potential is on the order of 15–20 volts.

4. The oscillator circuit of claim 1, in which said tuned circuit comprises a capacitance, said grid being connected in tapping relation to said capacitance.

5. The oscillator circuit of claim 4, in which said operating potential is on the order of 15–20 volts.

6. The oscillator circuit of claim 1, in which said tuned circuit comprises a capacitance comprising a transmission line, said grid being connected in tapping relation to said capacitance.

7. The oscillator circuit of claim 6, in which said operating potential is on the order of 15–20 volts.

8. The oscillator circuit of claim 1, in which said operating potential is on the order of 15–20 volts.

9. A zero grid bias oscillator circuit operable in the high frequency range above about 10 megacycles, comprising a high frequency tube comprising a cathode, plate and grid with said plate and said cathode inherently feedback-coupled, a D.C. connection between said grid and said cathode consisting essentially of an inductance, means for applying an operating potential between said plate and ground, said grid being free of any biasing potential, a tuned circuit comprising a tapped capacitance, means connecting said tuned circuit between said grid and ground, and RF choke means connected between said grid and ground.

10. The oscillator circuit of claim 9, in which said tuned circuit comprises a transmission line.

11. The oscillator circuit of claim 10, in which said operating potential is on the order of 15–20 volts.

12. The oscillator circuit of claim 9, in which said tuned circuit comprises a capacitance, said grid being connected in tapping relation to said capacitance.

13. The oscillator circuit of claim 12, in which said operating potential is on the order of 15–20 volts.

14. The oscillator circuit of claim 9, in which said tuned circuit comprises a capacitance comprising a transmission line, said grid being connected in tapping relation to said capacitance.

15. The oscillator circuit of claim 14, in which said operating potential is on the order of 15–20 volts.

16. The oscillator circuit of claim 9, in which said operating potential is on the order of 15–20 volts.

17. A zero grid bias oscillator circuit operable in the high frequency range above about 10 megacycles, comprising a high frequency tube comprising a cathode, plate and grid, the interelectrode capacitances of said tube providing feedback coupling between said cathode and said plate and said cathode and said grid, an unbiased D.C. connection means between said cathode and said grid and effective to modify the phase of said feedback coupling, means for applying an operating potential between said plate and ground, a tuned circuit, means connecting said tuned circuit between said grid and ground, and RF choke means connected between said grid and ground.

18. The oscillator circuit of claim 17, in which said tuned circuit comprises a transmission line.

19. The oscillator circuit of claim 17, in which said tuned circuit comprises a capacitance comprising a transmission line, said grid being connected in tapping relation to said capacitance.

20. The oscillator circuit of claim 17, in which said operating potential is on the order of 15–20 volts.

References Cited by the Examiner

UNITED STATES PATENTS

| | | | |
|---|---|---|---|
| 2,336,855 | 12/1943 | Fyler | 331—185 |
| 2,642,531 | 6/1953 | Baker | 331—185 |
| 2,801,339 | 7/1957 | Hubbard | 331—185 |

ROY LAKE, *Primary Examiner.*